(12) United States Patent
Copani et al.

(10) Patent No.: US 7,245,190 B2
(45) Date of Patent: Jul. 17, 2007

(54) TRANSFORMER-BASED VCO FOR BOTH PHASE NOISE AND TUNING RANGE IMPROVEMENT IN BIPOLAR TECHNOLOGY

(75) Inventors: Tino Copani, Riposto (IT); Santo Alessandro Smerzi, Catania (IT); Giovanni Girlando, Catania (IT); Giuseppe Palmisano, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/058,439

(22) Filed: Feb. 14, 2005

(65) Prior Publication Data

US 2006/0181355 A1    Aug. 17, 2006

(51) Int. Cl.
    *H03B 5/12*    (2006.01)
(52) U.S. Cl. ............................. 331/117 R; 331/36 C; 331/177 V

(58) Field of Classification Search ............... 331/36 C, 331/36 L, 108 C, 108 D, 117 R, 117 FE, 331/117 D, 167, 177 R, 177 V, 181
See application file for complete search history.

(56) References Cited

U.S. PATENT DOCUMENTS

2004/0066236 A1* 4/2004 Fujimoto et al. ........... 330/302
2006/0033587 A1* 2/2006 Cabanillas .............. 331/108 C

* cited by examiner

*Primary Examiner*—David Mis
(74) *Attorney, Agent, or Firm*—Lisa K. Jorgenson; Robert Iannucci; Seed IP Law Group PLLC

(57) ABSTRACT

A silicon bipolar VCO implementing a double-coupled transformer is disclosed. The VCO circuit, which is suitable in the field of integrated RF circuits, has been integrated into a universal LNB having a down-converter block and PLL merged into a single die and implemented in silicon bipolar technology. The integrated transformer is formed by three turns of stacked metal layers, where the topmost metal layer is employed for the resonator inductance. The VCO is missing conventional biasing resistors and decoupling capacitors, thus improving phase noise and tuning range performance.

30 Claims, 3 Drawing Sheets

TRANSFORMER-BASED VCO FOR BOTH PHASE NOISE AND TUNING RANGE IMPROVEMENT IN BIPOLAR TECHNOLOGY

BACKGROUND OF THE INVENTION

1. Field of the Invention

The present invention relates to integrated Voltage Controlled Oscillators (VCO) for RF applications. In particular, the invention relates to a transformer-based VCO for both phase noise and tuning range improvement in silicon bipolar technology.

The invention further relates to a Digital Video Broadcast-Satellite (DVB-S) receiver including a low noise block down-converter (LNB) for translating RF satellite signals picked up by a parabolic dish from a Ku-band to an intermediate frequency IF.

2. Description of the Related Art

In the last few years digital video broadcast services supported by geostationary satellites (DVB-S) have grown rapidly. In a DVB-S receiver the low noise block down-converter (LNB) translates the RF satellite signals picked up by a parabolic dish from the Ku-band (10.7–12.75 GHz) to an intermediate frequency IF ranging in the L-band (0.95–2.15 GHz).

The converted IF band is then sent to a decoder for tuning and digital demodulation.

LNB specifications are very challenging. See for instance the Technical Guide: EUTELSAT—"Information for Installers of HOT BIRD™ DVB-S Systems"—Vol. 1.

Indeed, an LO phase noise as low as −95 dBc/Hz at 100 kHz frequency offset from the carrier at 10 GHz has to be guaranteed.

In addition, an amplitude gain variation and an output P1 dB respectively within 8 dB and +5 dBm over the 2.05 GHz RF band must also be met.

Up to now, commercial LNBs have all been manufactured using discrete components. Usually, GaAs high electron mobility transistors (HEMT) and FET devices are used for the down-converter block, while dielectric resonator oscillators (DRO) are employed to generate the LO signal.

An integrated approach to LNB implementation would drastically reduce manufacturing costs. Moreover, the use of a PLL to generate the LO signal would eliminate the need for a testing phase to guarantee the accuracy of the oscillation frequency.

However, some technical problems are still to be solved to provide fully integrated solutions.

As is well know for those skilled in this specific technical art, voltage controlled oscillators (VCO) are circuit blocks of fundamental importance in radio-frequency integrated circuits.

The basic parameters for evaluating the performances of a VCO are: phase noise and tuning range.

The phase noise is an indicator of the spectrum purity of the generated oscillation; while the tuning range is the band in which it may be possible to control the oscillation frequency of the VCO.

In modern telecommunication systems the VCOs are requested to comply to more and more specific requirements in terms of phase noise and tuning range.

A conventional VCO structure realized by bipolar technology is shown in FIG. 1. The oscillation frequency of such a VCO is given by a resonator element LC wherein the capacitance C is the equivalent capacitance seen from the collector of each bipolar transistor Q1, Q2.

The capacitors CD and the resistors RB are used for providing a proper inverse biasing to the varactor diodes $C_v$.

For this biasing configuration, the parasitic capacitances CPk at the cathode terminals of the varactor diodes are connected to a virtual ground for the AC signals, so that they do not modify the oscillation frequency of the VCO structure.

While being advantageous under many points of view, this structure still suffers for some drawbacks.

Unfortunately, the capacitors CD, which are used to decouple the anode of the varactor diodes $C_v$, as well as the decoupling capacitors CDD, reduce the tuning range.

Moreover, the so-called thermal noise that is generated by the resistors RB increases the phase noise as well.

The biasing resistors RBB introduce a further contribution to the phase noise.

In this respect reference can be made to an article by: C. Samori, A. L. Laicata, A. Zanchi, S. Levantino, G. Cali, "Phase Noise Degradation At High Oscillation Amplitudes In LC-tuned VCOs," IEEE Journal of S—S Circuits, vol. 35, no. 1, pp. 96–99, January 2000.

In this article it is disclosed the Single Sideband to Carrier Ratio (SSCR) dependence on the oscillation amplitude of a fully integrated LC-tuned voltage-controlled oscillator, manufactured in high-speed bipolar technology.

As the oscillation amplitude increases, the SSCR reaches a minimum and then steeply rises, setting a limit to the range where better performance can be traded against higher power dissipation.

This dependence is fully explained by taking into account that noise and disturbances modulate the phase delay due to the active elements.

Known prior art solutions still don't provide a fully integrated circuit

BRIEF SUMMARY OF THE INVENTION

One embodiment of the present invention provides a transformer-based VCO in bipolar technology which eliminates biasing resistors and decoupling capacitors, thus improving both phase noise and tuning range.

An embodiment of the present invention is that of providing a silicon bipolar VCO implementing a differential integrated transformer which is double-coupled, and lacks conventional biasing resistors and decoupling capacitors, thus improving phase noise and tuning range performance.

The features and advantages of the transformer-based VCO according to the present invention will be apparent from the following detailed description of the embodiment thereof, given as non-limiting examples with reference to the accompanying drawings.

DETAILED DESCRIPTION OF THE INVENTION

Figure 2:
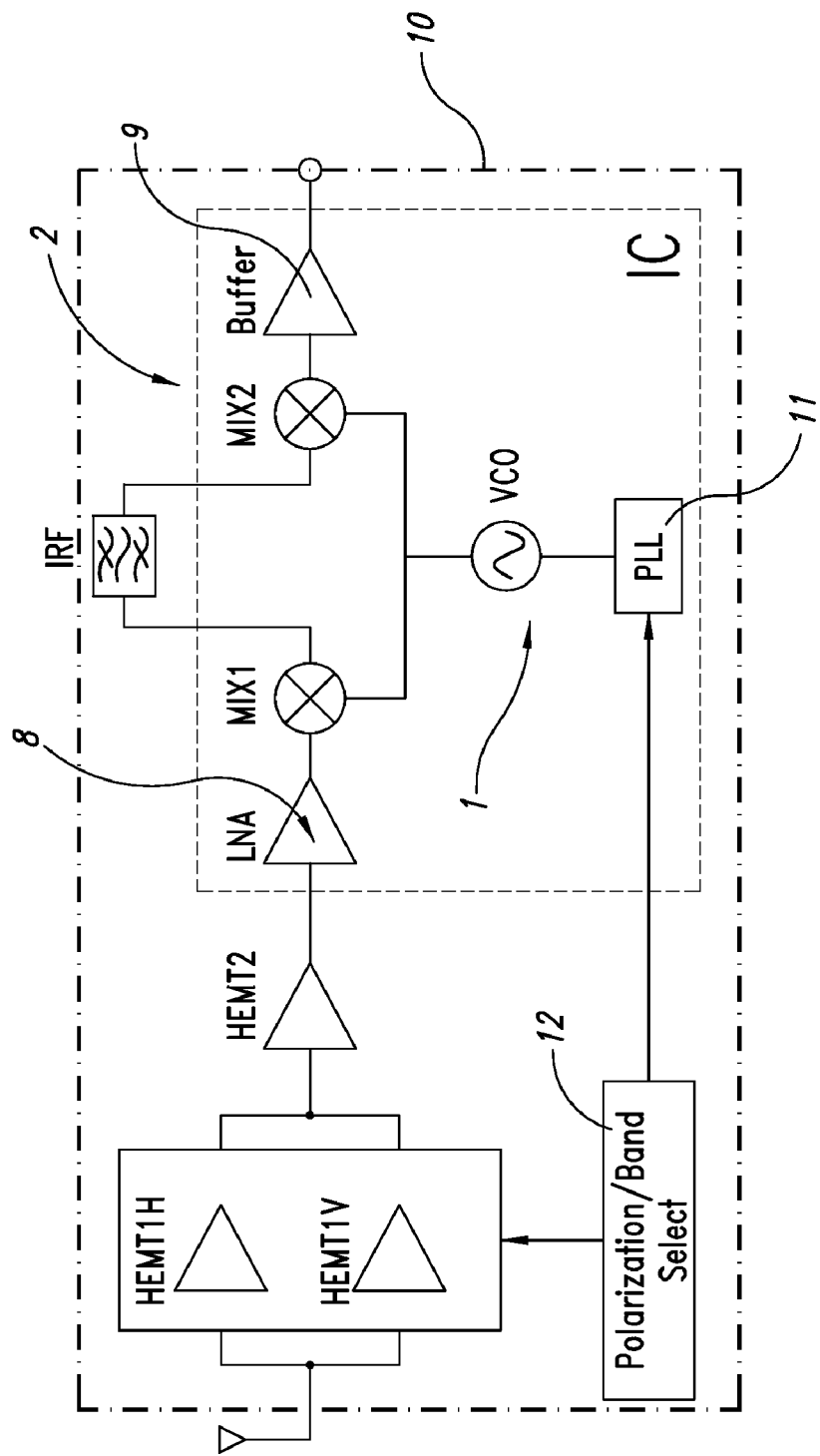
FIG. 2 shows a block diagram of a DVB-S receiver including a low noise block down-converter (LNB) translating the RF satellite signals picked up by a parabolic dish to an intermediate frequency IF.
Figure 3:
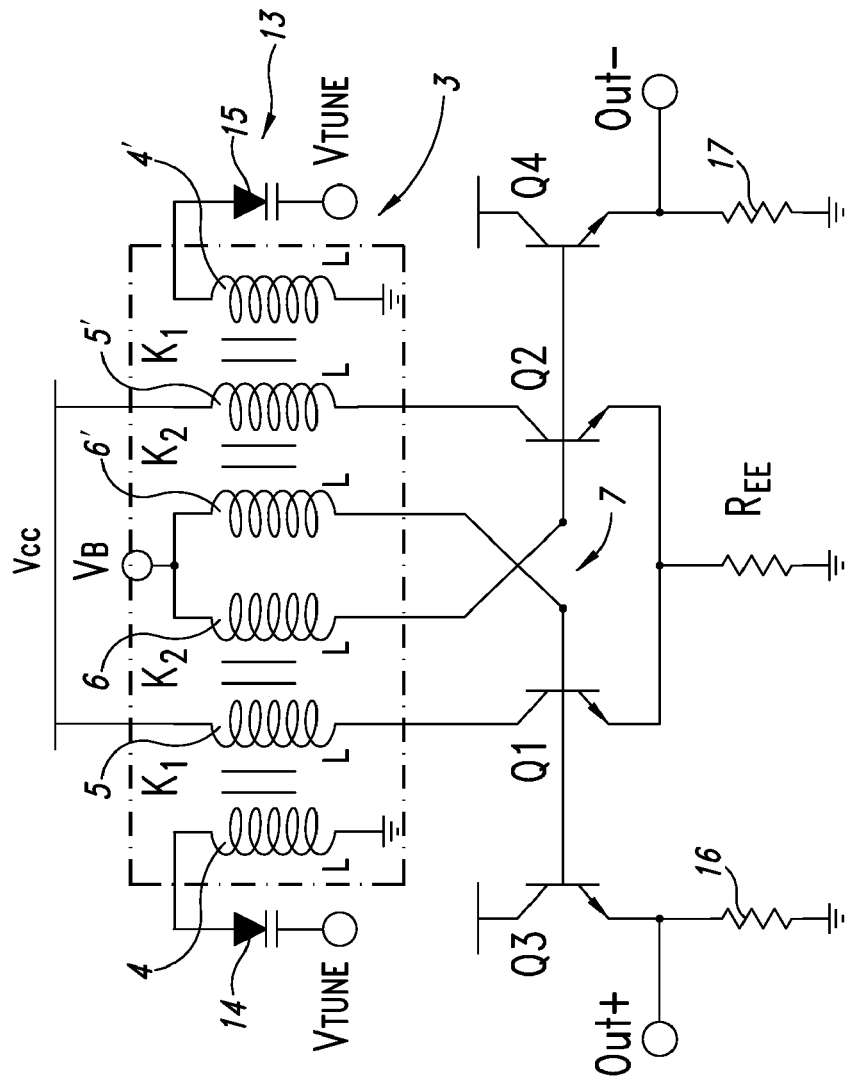
FIG. 3 shows schematically a transformer-based VCO incorporated into the down converter block of FIG. 2 and realized according to one embodiment of the present invention.

With reference to the drawings, and more specifically to the examples of FIGS. 2 and 3, with 1 is globally and schematically indicated a Transformer-Based VCO realized according to one embodiment of the present invention.

The VCO circuit 1 is incorporated in a DVB-S integrated receiver (IC) 2. The IC 2 is included in a low noise block down-converter (LNB) 10 which translates the RF satellite signals picked up by a parabolic dish from a Ku-band (in the range: 10.7–12.75 GHz) to an intermediate frequency IF ranging in a L-band (in the range: 0.95–2.15 GHz).

The converted IF band is then sent to a decoder for tuning and digital demodulation.

The LNB 10 includes a down-converter block and a PLL 11 that are integrated into a single die IC and implemented in a low-cost silicon bipolar technology. The block diagram of the LNB 10 is shown in FIG. 2.

More specifically, the receiver 2 is based on a dual-conversion superheterodyne architecture. The dashed box IC shows the integrated circuit. A low-noise amplifier (LNA) block 8 provides the gain and low noise figure, a mixer MIX1 converts the RF band into a first 7 GHz IF band, and a second mixer MIX2 carries out a second conversion to the final IF band.

An output buffer 9 guarantees the 5 dBm output P1 dB required by the standard. A PLL block 11 implements the LO for both mixers MIX1 and MIX2.

Conventionally, the RF band of the DVB-S application is split into a low-band (LB: 10.7–11.7 GHz) and a high-band (HB: 11.7–12.75 GHz).

The low-band LB and high-band HB are selected by locking the PLL oscillation frequency respectively to 4.875 GHz and 5.300 GHz.

As shown in FIG. 2, the LNB 10 includes external HEMTs for the low noise figure, an image rejection filter IRF between the first and the second mixer, and a control block 12 for the band and polarization selection. By enabling HEMT1H or HEMT1V branches either the horizontal (H) or the vertical (V) linear polarization can be selected.

The VCO circuit 1 is connected between the PLL block 11 and the two mixers MIX1 and MIX2.

This circuit 1 has been manufactured with a 46-GHz-$f_T$ bipolar technology. Details of the circuit 1 are shown in FIG. 3.

The VCO 1 is based on a three turns, double-coupled differential integrated transformer 3. It allows to improve both performances in terms of tuning range and phase noise if compared with the prior art solutions.

In particular, the VCO integrated differential transformer 3 comprises three stacked, single turn of metal circular inductors, to obtain the highest value for the coupling factor k. The topmost metal layer is used to realize resonator inductance to obtain the best quality factor.

The couples of coil (4–4'), (5–5') and (6–6') represent the inductances of each turn of the differential integrated transformer 3.

The coupling factor between the first and second turn is indicated with K1.

The coupling factor between the second and third turn is indicated with K2.

The coupling factor K1 may equal to the coupling factor K2 but may even be different from the coupling factor K2.

The three couples of coils (4–4'), (5–5') and (6–6') of the integrated transformer 3 realize an inductor for an LC resonator 13 that also includes first and second varactor diodes 14, 15 respectively coupled between the coils 4, 4' and the tuned voltage $V_{TUNE}$ provided by the PLL 11.

A DC path is provided for biasing the base terminals of the bipolar transistors Q1–Q2 of the cross-coupled pair 7 and the base terminals of the differential source follower buffer transistors Q3–Q4.

The transformer 3 provides:
the load for the cross-coupled pair 7;
the inductor for the LC resonator;
the feedback coupling between the resonator and the cross-coupled pair 7.

The unique transformer 3 does not require the use of the biasing resistors RB and RBB of the prior art solutions. Even the capacitors CD and CDD are missing in the VCO circuit 1.

The VCO 1 may thus be named as "resistor-less" and "capacitor-less". This improves a lot both phase noise and tuning range.

The VCO 1 includes resistors 16, 17 respectively coupled between ground and the source terminals of buffer transistors Q3 and Q4. In addition, the VCO 1 includes a resistor $R_{EE}$ coupled between ground and the source terminals of the cross-coupled transistors Q1, Q2.

Figure 1:
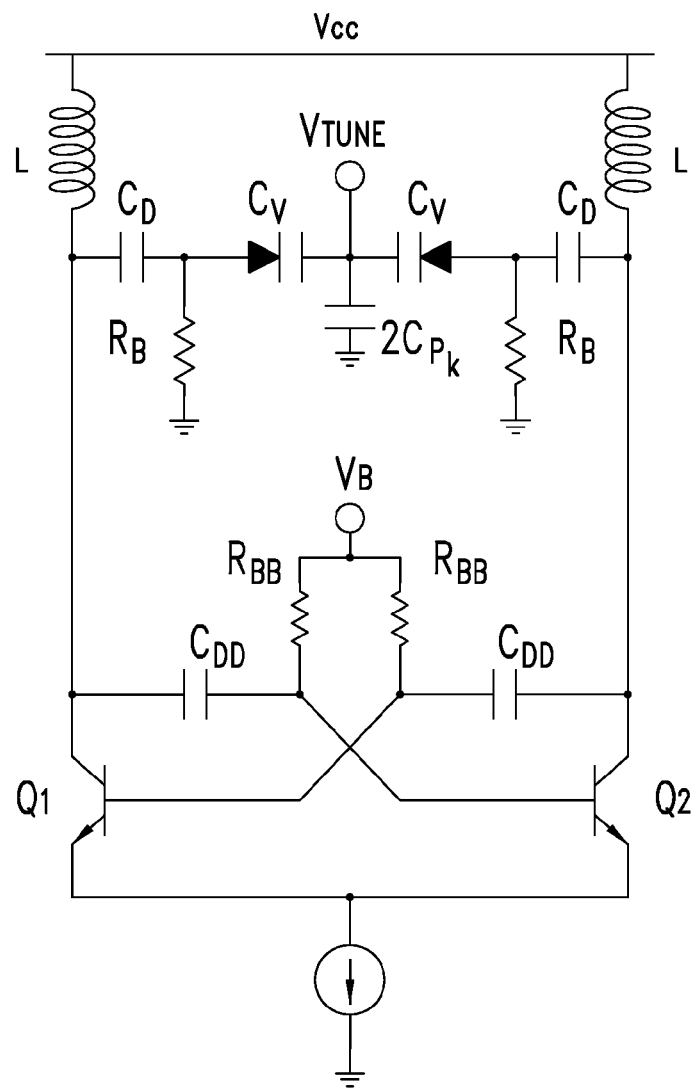
FIG. 1 shows schematically a Transformer-Based VCO according to the prior art.

This original idea has been validated comparing the simulation performance of the VCO 1 versus the state-of-the-art VCO shown in FIG. 1 using an oscillation frequency at 5 GHz; a voltage supply of 3.3 V and a biasing current of 8 mA.

Both circuits have been simulated by setting the same bias current and supply voltage and using a 46-GHz-fT silicon bipolar technology. The VCO 1 provides 16.7% tuning range increasing and 2.6 dB phase noise reduction.

In the following table 1 the simulation comparison parameters are reported:

| Parameter | State-of-the art VCO | VCO 1 |
| --- | --- | --- |
| VCC | 3.3 V | 3.3 V |
| IBIAS | 8 mA | 8 mA |
| fo | 5 GHz | 5 GHz |
| L | 0.7 nH | 0.7 nH |
| RB | 2 kΩ | — |
| CD | 5 pF | — |
| RBB | 2 kΩ | — |
| CDD | 5 pF | — |
| K | — | 0.87 |
| Phase Noise | −102.7 dBc/Hz @ 100 kHz | −105.3 dBc/Hz @ 100 kHz |
| Tuning Range | 4.7–5.18 GHz (9.7%) | 4.1–5.35 GHz (26.4%) |

Thus, the VCO circuit 1 allows to improve the tuning range of about 16.7% with respect to the known solution having better performances.

The phase noise has been reduced as well of about 2.6 dB.

The VCO 1 removes conventional biasing resistors and decoupling capacitors, thus improving phase noise and tuning range performance.

This original idea has been validated comparing the simulation performance of the proposed VCO versus the state-of-the-art VCO at 5 GHz.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A transformer-based VCO for both phase noise and tuning range improvement in bipolar technology, comprising:
   a double coupled integrated transformer that includes a first pair of coils magnetically coupled to a second pair of coils, the first pair including first and second coils and the second pair including third and fourth coils; and
   a differential cross-coupled pair of first and second transistors, the first transistor having a first conduction terminal connected to the first coil and a control terminal connected to the third coil, and the second transistor having a first conduction terminal connected to the second coil and a control terminal connected to the fourth coil.

2. A transformer-based VCO according to claim 1, wherein said integrated transformer includes three turns that are double coupled, wherein two of the three turns are implemented by the first and second pairs of coils.

3. A transformer-based VCO according to claim 2, wherein a coupling between first and second turns of the three turns has a coupling factor K1 that is equal to a coupling factor K2 between said second turn and a third turn of the three turns.

4. A transformer-based VCO according to claim 2, wherein a coupling between first and second turns of the three turns has a coupling factor K1 that is different from a coupling factor K2 between said second turn and a third turn of the three turns.

5. A transformer-based VCO according to claim 1, wherein the integrated transformer is formed by three stacked metal layers.

6. A transformer-based VCO according to claim 5, wherein the integrated transformer employs a topmost metal layer of the metal layers for a resonator inductance.

7. A transformer-based VCO according to claim 1, further comprising:
   a third transistor having a control terminal connected to the control terminal of the first transistor and a conduction terminal configured to produce a first output; and
   a fourth transistor having a control terminal connected to the control terminal of the second transistor and a conduction terminal configured to produce a first output.

8. A transformer-based VCO according to claim 1, wherein said integrated transformer includes a third pair of coils magnetically coupled to the first pair of coils, the third pair including fifth and sixth coils.

9. A transformer-based VCO according to claim 8, wherein said differential cross-coupled pair of transistors is a differential cell including bipolar transistors.

10. A transformer-based VCO according to claim 8, further comprising first and second varactor diodes coupled to the fifth and sixth coils, respectively.

11. A transformer-based VCO according to claim 8, wherein the integrated transformer is coupled directly to respective control terminals of the transistors without any intervening decoupling capacitors.

12. A DVB-S receiver, comprising a low noise block down-converter (LNB) for translating RF satellite signals picked up by a parabolic dish from a Ku-band to an intermediate frequency IF, the LNB down-converter including a transformer-based VCO including a double coupled integrated transformer.

13. A receiver according to claim 12, wherein said low noise block down-converter includes a down-converter block and a PLL integrated into a single die with the transformer.

14. A receiver according to claim 12 and based on a dual-conversion superheterodyne architecture.

15. A receiver according to claim 12, wherein said integrated transformer includes three turns that are double coupled.

16. A receiver according to claim 15, wherein a coupling between first and second turns of the three turns has a coupling factor K1 that is equal to a coupling factor K2 between said second turn and a third turn of the three turns.

17. A receiver according to claim 15, wherein a coupling between a first and second turns of the three turns has a coupling factor K1 that is different from a coupling factor K2 between said second turn and a third turn of the three turns.

18. A receiver according to claim 15, wherein the integrated transformer is formed by three stacked metal layers.

19. A receiver according to claim 18, wherein the integrated transformer employs a topmost metal layer of the metal layers for a resonator inductance.

20. A receiver according to claim 12, wherein a differential load is provided by a cross-coupled differential cell including bipolar transistors coupled to the integrated transformer.

21. A receiver according to claim 12, wherein said VCO includes first and second varactor diodes coupled to the integrated transformer.

22. A receiver according to claim 12, wherein said integrated transformer is part of an LC resonator coupled to a cross-coupled differential pair of transistors.

23. A receiver according to claim 22, wherein said cross-coupled differential pair is a differential cell including bipolar transistors.

24. A receiver according to claim 22, wherein the integrated transformer is coupled directly to respective control terminals of the transistors without any intervening decoupling capacitors.

25. A transformer-based VCO, comprising:
   a differential cell providing a differential output; and
   a double coupled integrated transformer coupled to the differential cell, wherein the differential cell includes a cross-coupled pair of bipolar transistiors and the transformer includes;
   a first pair of coils coupled respectively to first and second capacitances;
   a second pair of coils coupled respectively to the coils of the first pair and to the differential cell; and
   a third pair of coils coupled respectively to the coils of the second pair and to the differential cell.

26. The VCO of claim 25 wherein the transformer is part of an LC resonator that includes a varactor diode coupled to the transformer.

27. The VCO of claim 25 wherein the differential cell includes a cross-coupled pair of transistors respectively having first conduction terminal coupled respectively to the coils of the second pair, second conduction terminals coupled to each other, and control terminals coupled to the coils of the third pair.

28. A transformer-based VCO, comprising:
a differential cell providing a differential output; and
a double coupled integrated transformer coupled to the differential cell, wherein the transformer includes:
a first pair of coils coupled respectively to first and second capacitances;
a second pair of coils coupled respectively to the coils of the first pair and to the differential cell; and
a third pair of coils coupled respectively to the coils of the second pair and to the differential cell.

29. The VCO of claim 28 wherein the transformer is part of an LC resonator that includes a varactor diode coupled to the transformer.

30. The VCO of claim 28 wherein the differential cell includes a cross-coupled pair of transistors respectively having first conduction terminal coupled respectively to the coils of the second pair, second conduction terminals coupled to each other, and control terminals coupled to the coils of the third pair.

* * * * *